United States Patent
Sun et al.

(10) Patent No.: US 12,019,351 B2
(45) Date of Patent: Jun. 25, 2024

(54) DISPLAY PANEL, DISPLAY DEVICE AND TERMINAL

(71) Applicants: BEIJING BOE DISPLAY TECHNOLOGY CO., LTD., Beijing (CN); BOE TECHNOLOGY GROUP CO., LTD., Beijing (CN)

(72) Inventors: Shumeng Sun, Beijing (CN); Minghui Zhang, Beijing (CN); Inho Park, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 697 days.

(21) Appl. No.: 17/264,355

(22) PCT Filed: Jul. 15, 2020

(86) PCT No.: PCT/CN2020/102189
§ 371 (c)(1),
(2) Date: Jan. 29, 2021

(87) PCT Pub. No.: WO2021/013018
PCT Pub. Date: Jan. 28, 2021

(65) Prior Publication Data
US 2021/0294179 A1 Sep. 23, 2021

(30) Foreign Application Priority Data
Jul. 23, 2019 (CN) .......................... 201910667203.9

(51) Int. Cl.
*H01L 27/146* (2006.01)
*G02F 1/1335* (2006.01)
(Continued)

(52) U.S. Cl.
CPC ........ *G02F 1/294* (2021.01); *G02F 1/133512* (2013.01); *H01L 27/14627* (2013.01);
(Continued)

(58) Field of Classification Search
CPC ......... H10K 59/351–353; H10K 59/50; H10K 59/121; G02F 1/294; G02F 1/133514; G02B 3/0037; H04M 1/0264
See application file for complete search history.

(56) References Cited

U.S. PATENT DOCUMENTS

2015/0130751 A1* 5/2015 Teraguchi ............. G06F 3/0412
345/80
2017/0034503 A1 2/2017 Zhou et al.
(Continued)

FOREIGN PATENT DOCUMENTS

CN 107688243 A 2/2018
CN 109188824 A 1/2019
(Continued)

OTHER PUBLICATIONS

Machine Translation of CN 110012136 A (Year: 2019).*
(Continued)

*Primary Examiner* — Eric K Ashbahian
*Assistant Examiner* — Halee Cramer
(74) *Attorney, Agent, or Firm* — LIPPES MATHIAS LLP

(57) ABSTRACT

A display panel includes: a first base substrate and a second base substrate which are opposite to each other, and a plurality of lens imaging modules. The first base substrate includes a plurality of pixel units arranged in an array. The plurality of lens imaging modules are located between the first base substrate and the second base substrate, and an orthogonal projection of the lens imaging module on the first base substrate is located between two adjacent pixel units. Therefore, the lens imaging modules are disposed inside the
(Continued)

display panel without affecting display of the display panel, such that a screen-to-body ratio can be significantly increased, which is advantageous for achieving borderless full-screen display.

18 Claims, 9 Drawing Sheets

(51) Int. Cl.
  *G02F 1/29* (2006.01)
  *H10K 59/50* (2023.01)
  *H10K 59/65* (2023.01)
(52) U.S. Cl.
  CPC ............ *H10K 59/50* (2023.02); *H10K 59/65* (2023.02); *G02F 2201/44* (2013.01)

(56) References Cited

U.S. PATENT DOCUMENTS

| | | | |
|---|---|---|---|
| 2017/0193963 A1* | 7/2017 | Pan | G09G 3/3648 |
| 2018/0157056 A1 | 6/2018 | Liu et al. | |
| 2019/0014266 A1* | 1/2019 | Cho | G02F 1/133509 |
| 2019/0206953 A1 | 7/2019 | Hsieh et al. | |
| 2019/0266939 A1* | 8/2019 | Slobodin | G09G 3/3208 |
| 2020/0233211 A1 | 7/2020 | Li et al. | |

FOREIGN PATENT DOCUMENTS

| | | | | |
|---|---|---|---|---|
| CN | 109285860 A | | 1/2019 | |
| CN | 109752873 A | | 5/2019 | |
| CN | 109782445 A | | 5/2019 | |
| CN | 109814304 A | | 5/2019 | |
| CN | 110012136 A | * | 7/2019 | .......... G02B 3/0037 |
| CN | 110012136 A | | 7/2019 | |
| CN | 209089023 U | | 7/2019 | |
| CN | 110266861 A | | 9/2019 | |

OTHER PUBLICATIONS

First office action of Chinese application No. 201910667203.9 dated Jul. 23, 2020.
Second office action of Chinese application No. 201910667203.9 dated Mar. 26, 2021.

* cited by examiner

DISPLAY PANEL, DISPLAY DEVICE AND TERMINAL

The present disclosure is a 371 of PCT Application No. PCT/CN2020/102189 filed on Jul. 15, 2020, which claims priority to Chinese Patent Application No. 201910667203.9, filed on Jul. 23, 2019 and entitled "DISPLAY PANEL AND DISPLAY DEVICE", the entire content of which is incorporated herein by reference.

TECHNICAL FIELD

The present disclosure relates to the field of display technologies, and in particular to a display panel, a display device and a terminal.

BACKGROUND

With continuous development of the display technology, users have higher and higher requirements on display devices.

At present, in order to achieve a larger area of a display region of the display device, a sensor, a fingerprint recognition sensor and other structures which are located on a display screen in a traditional display device are disposed inside the display screen to significantly increase a screen-to-body ratio, and increase the area of the display region.

SUMMARY

Inventors found that the display device at the present stage generally needs to sacrifice a part of the display region to accommodate a camera, that is, the display device with a large screen-to-body ratio also needs to retain a "forehead" or "chin". Specifically, the camera is located at the uppermost position of the display screen, and is in a shape like "a fringe" or "a water droplet", or the camera is located at the bottommost position of the display screen. As a result, the current display device inevitably has the "forehead" or "chin", and cannot achieve a true full screen.

In one aspect of the present disclosure, a display panel is provided. The display panel includes:
 a first base substrate and a second base substrate which are opposite to each other, and a plurality of lens imaging modules; wherein
 the first base substrate comprises a plurality of pixel units arranged in an array, and each of the lens imaging modules includes an image sensor and a lens unit with an adjustable focal length; and
 the plurality of lens imaging modules are located between the first base substrate and the second base substrate, and an orthogonal projection of the lens imaging module on the first base substrate is located between two adjacent pixel units.

Optionally, a color filter layer is disposed on a side of the second base substrate facing the first base substrate, wherein the color filter layer includes a plurality of photoresist blocks, and the lens imaging module is disposed in the color filter layer and located between two adjacent photoresist blocks.

Optionally, the pixel unit includes an organic electroluminescent device, the pixel unit is located on a side of the first base substrate facing the second base substrate, and the lens imaging module is disposed on the first base substrate and located between two adjacent organic electroluminescent devices.

Optionally, the pixel unit includes an organic electroluminescent device, the pixel unit is located on a side of the first base substrate facing the second base substrate, the lens imaging module is located on a side of the second base substrate facing the first base substrate, and the orthogonal projection of the lens imaging module on the first base substrate is located between two adjacent organic electroluminescent devices.

Optionally, the lens imaging module includes a first substrate and a second substrate which are opposite to each other, and the image sensor and the lens unit are located between the first substrate and the second substrate.

Optionally, the lens unit includes:
 a first electrode and a second electrode, wherein the first electrode is located on a side of the first substrate facing the second substrate, the second electrode is located on a side of the second substrate facing the first substrate, and extension directions of both the first electrode and the second electrode are parallel to a direction of a plane of the first substrate;
 a third electrode and a fourth electrode which are opposite to each other, wherein extension directions of both the third electrode and the fourth electrode are perpendicular to a direction of a plane of the first electrode, and the first electrode, the second electrode, the third electrode, and the fourth electrode are insulated from one another;
 a first insulating retaining wall, wherein an extension direction of the first insulating retaining wall is perpendicular to the direction of the plane of the first electrode, and defines an enclosed space with the first electrode, the second electrode, the third electrode, and the fourth electrode;
 a second transparent insulating liquid filled in the enclosed space; and
 a liquid lens located in the second transparent insulating liquid.

Optionally, the liquid lens includes charged particles coated by a transparent flexible film and a first transparent insulating liquid, wherein the charged particles include positively charged particles and negatively charged particles, and a refractive index of the first transparent insulating liquid is greater than a refractive index of the second transparent insulating liquid.

Optionally, a density of the charged particles is less than or equal to a density of the first transparent insulating liquid.

Optionally, a size range of the charged particles is 0.05 μm to 50 μm.

Optionally, the charged particles include at least one of electrophoretic particles or electronic ink.

Optionally, a total volume of the charged particles is 0.1% to 5% of a volume of the liquid lens.

Optionally, the first electrode and the second electrode are configured to form an electric field in a direction perpendicular to the first substrate, the third electrode and the fourth electrode are configured to form an electric field in a direction parallel to the first substrate, and an intensity of the electric field formed by the first electrode and the second electrode is 1% to 20% of an intensity of the electric field formed by the third electrode and the fourth electrode.

Optionally, the electric field formed between the first electrode and the second electrode causes central points of the plurality of liquid lenses to be located on a same plane.

Optionally, the first substrate is located on a side of the lens imaging module distal from a light-emitting side of the display panel, and the image sensor is located between the first substrate and the first electrode.

Optionally, the lens unit includes:

a second insulating retaining wall, wherein an extension direction of the second insulating retaining wall is perpendicular to the direction of the plane of the first electrode, is parallel to the third electrode, and is located on each of a side of the third electrode distal from the enclosed space and a side of the fourth electrode distal from the enclosed space.

Optionally, the lens unit includes:

light-shielding layers, wherein the light-shielding layers are located on each of a side of the first electrode facing the liquid lens and a side of the second electrode facing the liquid lens, and the light-shielding layer are, respectively, located between the first electrode and the third electrode, between the first electrode and the fourth electrode, between the second electrode and the third electrode, and between the second electrode and the fourth electrode.

Optionally, orthogonal projections of the light-shielding layers on the first electrode cover edges of an orthogonal projection of the liquid lens on the first electrode, and areas of the light-shielding layers are configured to cause all light rays incident into the lens unit to be emitted after being refracted by the liquid lens.

Optionally, a data line is disposed on the light-shielding layer, wherein the data line is connected to each of the third electrode and the fourth electrode.

Optionally, a color filter layer is disposed on a side of the second base substrate facing the first base substrate, the color filter layer includes a plurality of photoresist blocks, and the lens imaging module is disposed in the color filter layer and located between two adjacent photoresist blocks;

the pixel unit includes an organic electroluminescent device, and the lens imaging module is disposed on the first base substrate and located between two adjacent organic electroluminescent devices;

the pixel unit includes an organic electroluminescent device, the lens imaging module is located on a side of the second base substrate facing the first base substrate, and an orthogonal projection of the lens imaging module on the first base substrate is between two adjacent organic electroluminescent devices;

the lens imaging module includes a first substrate and a second substrate which are opposite to each other, and the image sensor and the lens unit are located between the first substrate and the second substrate;

the lens unit includes:

a first electrode and a second electrode, wherein the first electrode is located on a side of the first substrate facing the second substrate, the second electrode is located on a side of the second substrate facing the first substrate, and extension directions of both the first electrode and the second electrode are parallel to a direction of a plane of the first substrate;

a third electrode and a fourth electrode which are opposite to each other, wherein extension direction of both the third electrode and the fourth electrode are perpendicular to a direction of a plane of the first electrode, and the first electrode, the second electrode, the third electrode, and the fourth electrode are insulated from one another;

a first insulating retaining wall, wherein an extension direction of the first insulating retaining wall is perpendicular to the direction of the plane of the first electrode, and defines an enclosed space with the first electrode, the second electrode, the third electrode, and the fourth electrode;

a second transparent insulating liquid filled in the enclosed space; and a liquid lens located in the second transparent insulating liquid, wherein the liquid lens includes charged particles coated by a transparent flexible film and a first transparent insulating liquid, wherein the charged particles include positively charged particles and negatively charged particles, and a refractive index of the first transparent insulating liquid is greater than a refractive index of the second transparent insulating liquid.

In another aspect of the present disclosure, a display device is provided. The display device includes the above display panel.

In another aspect of the present disclosure, a terminal is provided. The terminal includes the above display device.

DESCRIPTION OF REFERENCE NUMBERS

100: first base substrate; 200: second base substrate; 300: pixel unit; 400: lens imaging module; 410: first substrate; 420: second substrate; 430: lens unit; 440: image sensor; 500: color filter layer; 510: photoresist block; 600: liquid crystal layer; 700: organic electroluminescent device; 800: packaging structure; 10: first electrode; 20: second electrode; 30: third electrode; 40: fourth electrode; 50: liquid lens; 51: transparent flexible film; 52: charged particles; 53: first transparent insulating liquid; 61: first insulating retaining wall; 62: second insulating retaining wall; 70: light-shielding layer; 71: data line; 80: second transparent insulating liquid; 90: sealant; 11: enclosed space; 1: display device.

DETAILED DESCRIPTION

Reference will be made in detail to the embodiments of the present disclosure, examples of which are illustrated in the accompanying drawings. The reference numbers which are the same or similar throughout the accompanying drawings represent the same or similar elements or elements with the same or similar functions. The embodiments described below with reference to the accompanying drawings are illustrative, and only used to explain the present disclosure, but may not to be interpreted as the restrictions of the present disclosure.

Figure 1:
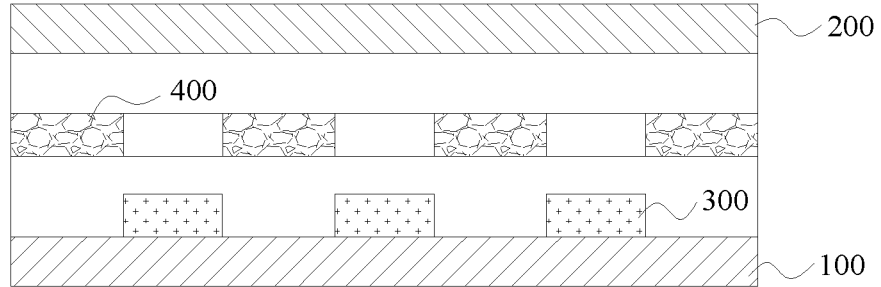
FIG. 1 shows a schematic structural diagram of a display panel according to an embodiment of the present disclosure.

In one aspect of the present disclosure, the present disclosure provides a display panel. According to an embodiment of the present disclosure, referring to FIG. 1, the display panel includes: a first base substrate 100, a second base substrate 200, pixel units 300, and a plurality of lens imaging modules 400. The second base substrate 200 and the first base substrate 100 are opposite to each other. A side of the first base substrate 100 facing the second base substrate 200 includes a plurality of pixel units 300 arranged in an array. The plurality of lens imaging modules 400 are located between the first base substrate 100 and the second base substrate 200, and an orthogonal projection of the lens imaging module 400 on the first base substrate 100 is located between two adjacent pixel units 300. Each of the lens imaging modules 400 includes an image sensor 440 and a lens unit 430 with an adjustable focal length (referring to FIG. 6). Thus, the lens imaging module is disposed inside the display panel. On one hand, the lens imaging module located inside the display panel can realize a photographing function. On the other hand, the lens imaging module does not affect the display of the display panel. On another hand, a screen-to-body ratio can be significantly increased, and the "forehead" or "chin" can no longer exist, which is advantageous for achieving borderless full-screen display.

The present disclosure uses the lens imaging module with an optically adjustable focus microlens instead of a traditional lens camera to collect images. The pictures collected by respective lens imaging modules may be identified by a system algorithm, and the entire picture is calculated and recombined, that is, the pictures collected by the plurality of lens imaging modules are identified and recombined to form a final photographing picture to realize a photographing function. That is, the present disclosure can realize the photographing function without using a traditional large-size lens, and the lens imaging modules are disposed inside the display panel, thereby significantly increasing the screen-to-body ratio. The orthogonal projection of the lens imaging module on the first base substrate is located between two adjacent pixel units, without affecting the display of the display panel. The display panel is advantageous for achieving the borderless full-screen display.

A specific process of using the system algorithm to identify the images collected by the lens imaging modules is not particularly limited, and may be designed by those skilled in the art according to particular conditions.

The following describes respective structures of the display panel according to specific embodiments of the present disclosure.

Figure 2:
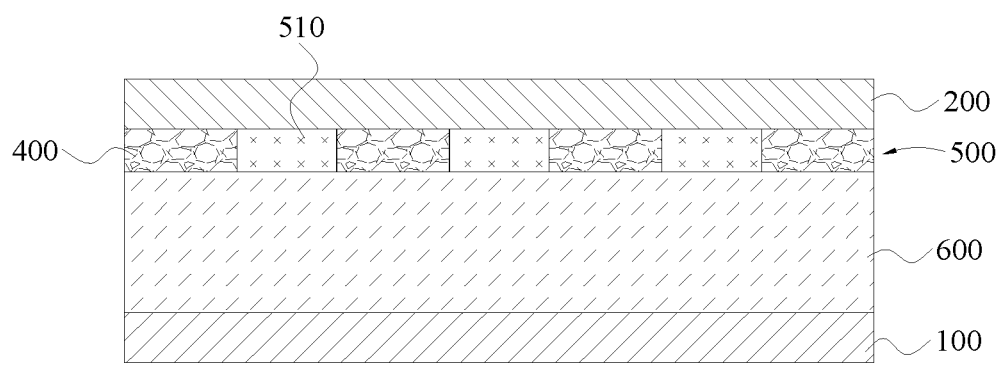
FIG. 2 shows a schematic structural diagram of a display panel according to another embodiment of the present disclosure.

According to an embodiment of the present disclosure, referring to FIG. 2, a color filter layer 500 is disposed on a side of the second base substrate 200 facing the first base substrate 100. The color filter layer 500 includes a plurality of photoresist blocks 510, and the lens imaging module 400 is located in the color filter layer 500 and located between two adjacent photoresist blocks 510. The lens imaging module is disposed between two adjacent photoresist blocks. That is, the lens imaging module is located at the position of a black matrix in a traditional color filter. On one hand, the lens imaging module has the characteristic of being opaque to light, and can prevent cross-color (the cross-color may refer to a situation where color light emitted by adjacent pixels or sub-pixels are mixed with each other inside the display panel), that is, the function of the traditional black matrix is realized. On the other hand, the lens imaging module is disposed in the color filter, such that a thickness of the display panel is not increased, which is favorable to lightness and thinness of the display device.

According to an embodiment of the present disclosure, the lens imaging module 400 is disposed in the color filter layer 500, and the display panel may be a liquid crystal display panel. As shown in FIG. 2, a side of the first base substrate 100 facing the second base substrate 200 is provided with a liquid crystal layer 600. The color filter layer 500 is disposed on a side of the liquid crystal layer 600 distal from the first base substrate 100, and the liquid crystal layer 600 and the corresponding photoresist block 510 form a pixel unit.

Optionally, the display panel may also be an organic electroluminescent display panel. A side of the first base substrate 100 facing the second base substrate 200 is provided with an organic electroluminescent device, and the color filter layer 500 is disposed on a side of the organic electroluminescent device distal from the first base substrate 100. The organic electroluminescent device and the corresponding photoresist block form a pixel unit (this case is not shown in the figure). Optionally, the organic electroluminescent device includes an organic light-emitting diode (OLED).

It should be noted that the pixel unit may be understood in a broad sense. For example, the pixel unit may be a single sub-pixel. In this case, the orthogonal projection of the lens imaging module on the first base substrate is located between two adjacent sub-pixels. As shown in FIG. 2, the lens imaging module 400 is located between two adjacent photoresist blocks 510. There is no need to dispose the black matrix under this condition. Alternatively, the pixel unit may also be a pixel formed by a plurality of sub-pixels. In this case, the orthogonal projection of the lens imaging module on the first base substrate is located between two adjacent pixels. For example, three sub-pixels of red, green, and blue form one pixel, and a red photoresist block, a green photoresist block, and a blue photoresist block are taken as one pixel unit, and the lens imaging module 400 is located between two adjacent red, green, and blue photoresist block units. Under this condition, the black matrix may be disposed between two adjacent photoresist blocks in the red, green, and blue photoresist block units. For example, the black matrix is disposed between the red photoresist block and the green photoresist block, and the black matrix is disposed between the green photoresist block and the blue photoresist block.

Figure 3:
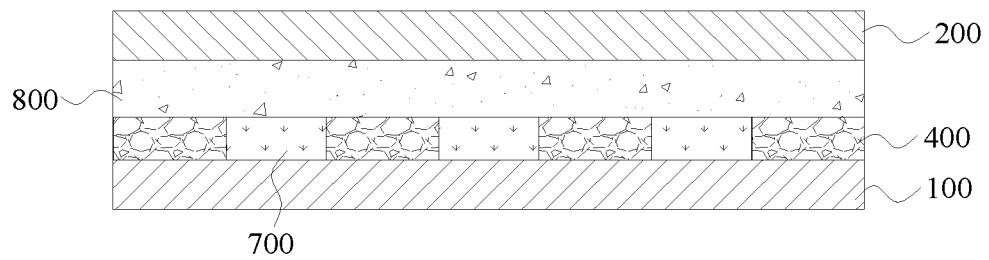
FIG. 3 shows a schematic structural diagram of a display panel according to another embodiment of the present disclosure.

According to an embodiment of the present disclosure, the display panel may be an organic electroluminescent display panel. In this case, the display panel may be provided with a color filter layer or not provided with a color filter layer (for example, the organic electroluminescent device may present red light, green light, blue light respectively). The lens imaging module 400 may be disposed on the first base substrate 100 and located between two adjacent organic electroluminescent devices 700 (referring to FIG. 3). The lens imaging module is disposed between two adjacent organic electroluminescent devices. That is, the lens imaging module is located at the position of a pixel defining structure of a traditional organic electroluminescent device. On one hand, the lens imaging module has the characteristic of being opaque to light and can prevent cross-color, that is, the function of the traditional pixel defining structure is realized. On the other hand, the lens imaging module will not increase a thickness of the display panel, which is favorable to realize lightness and thinness of the display device. In the present embodiment, both the lens imaging module 400 and the organic electroluminescent device 700 are packaged in a packaging structure 800, which is, however, not limited in the embodiment of the present disclosure.

Figure 4:
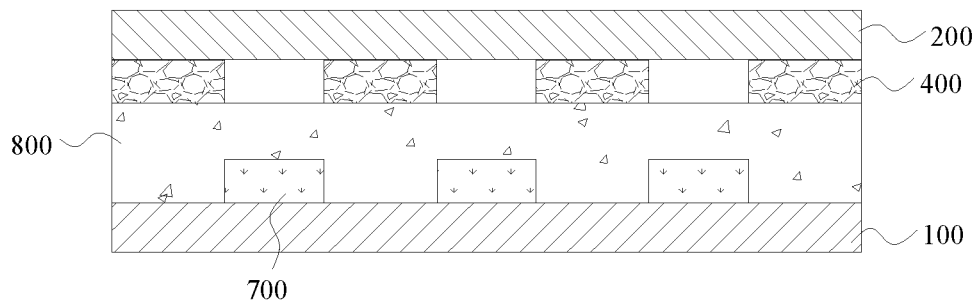
FIG. 4 shows a schematic structural diagram of a display panel according to another embodiment of the present disclosure.

According to an embodiment of the present disclosure, when the color filter layer is not disposed in the organic electroluminescent display panel, the lens imaging module 400 may also be disposed on a side of the second base substrate 200 facing the first base substrate 100, and the orthogonal projection of the lens imaging module 400 on the first base substrate 100 is located between two adjacent organic electroluminescent devices 700 (referring to FIG. 4). Therefore, the lens imaging module is disposed inside the display panel, can realize a photographing function without affecting the display of the display panel, and can significantly increase the screen-to-body ratio.

It should be noted that in the present embodiment, the organic electroluminescent device 700 is packaged in the packaging structure 800, and the lens imaging module 400 may be located on a side of the packaging structure 800 distal from the first base substrate 100.

Figure 5:
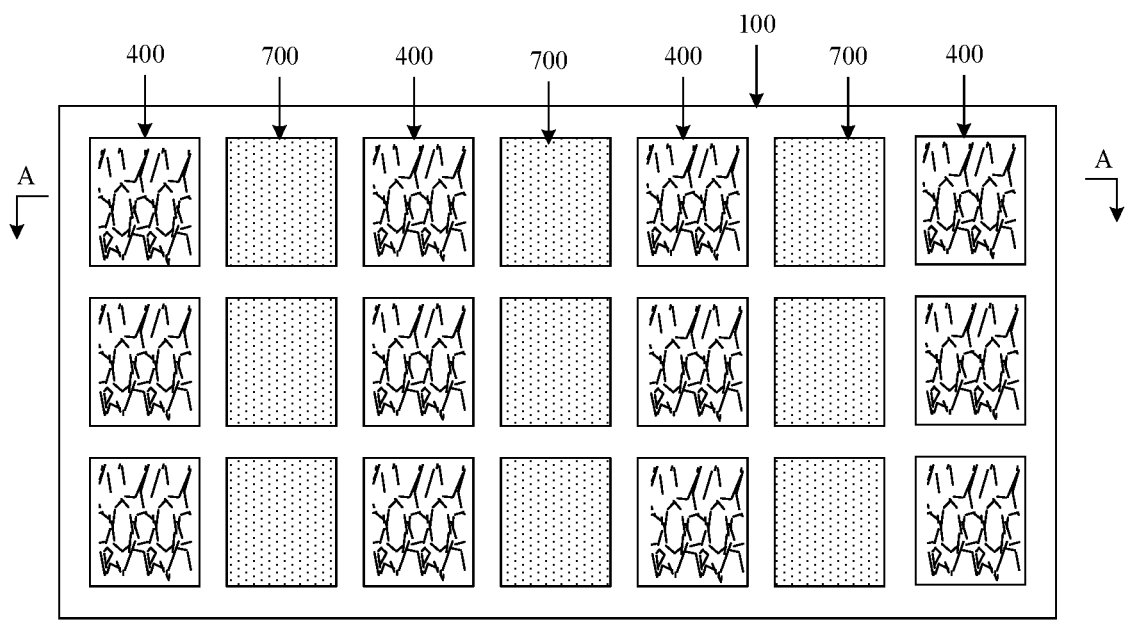
FIG. 5 shows a top view of the display panel shown in FIG. 4.

Exemplarily, as shown in FIG. 5, which is a top view of FIG. 4, it can be seen that the lens imaging module 400 is located between two adjacent organic electroluminescent devices 700 on the first base substrate 100. FIG. 4 may be a sectional view of FIG. 5 at A-A.

Figure 6:
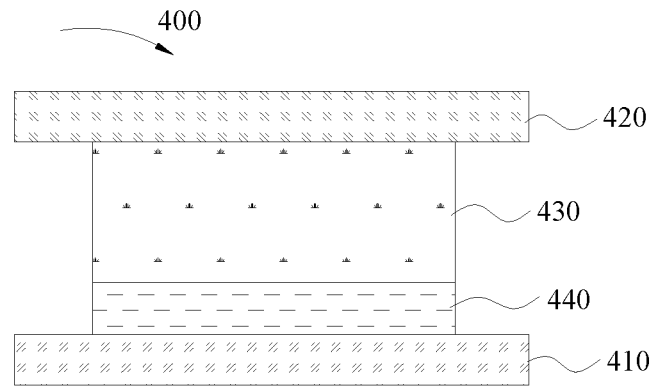
FIG. 6 shows a schematic structural diagram of a lens imaging module according to an embodiment of the present disclosure.

According to an embodiment of the present disclosure, referring to FIG. 6, the lens imaging module 400 may include: a first substrate 410 and a second substrate 420 which are opposite to each other, and an image sensor 440 and a lens unit 430 which are located between the first substrate 410 and the second substrate 420. With such a structure, the first substrate and the second substrate may play a role in supporting and fixing the lens unit and the image sensor.

Figure 7:
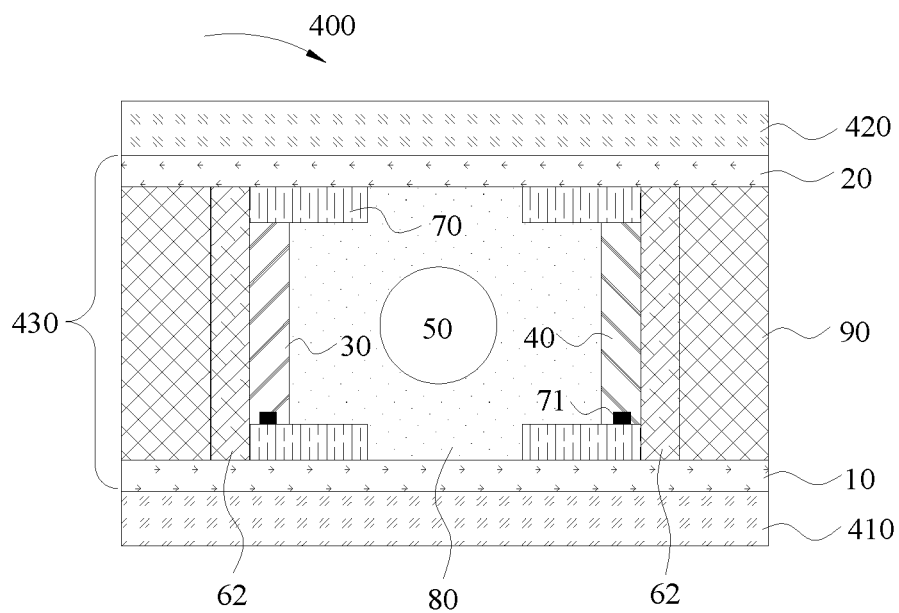
FIG. 7 shows a schematic structural diagram of a lens imaging module according to another embodiment of the present disclosure.
Figure 8:
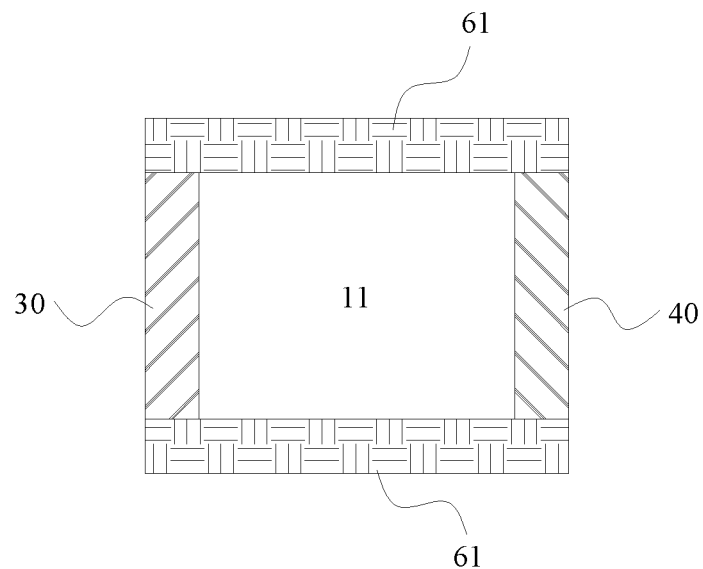
FIG. 8 shows a partial schematic structural diagram of a lens unit according to an embodiment of the present disclosure.
Figure 9:
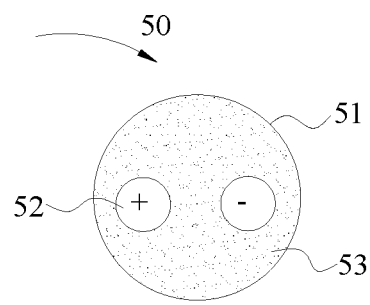
FIG. 9 shows a schematic structural diagram of a lens according to an embodiment of the present disclosure.

According to an embodiment of the present disclosure, referring to FIG. 7, the lens unit 430 may include: a first electrode 10, a second electrode 20, a third electrode 30, a fourth electrode 40, first insulating retaining walls 61, a second transparent insulating liquid 80, and a liquid lens 50. The first electrode 10 is located on a side of the first substrate 410 facing the second substrate 420, and the second electrode 20 is disposed on a side of the second substrate 420 facing the first substrate 410, and extension direction of both the first electrode 10 and the second electrode 20 are parallel to a direction of a plane of the first substrate 410 (that is, both the first electrode and the second electrode extend into a sheet shape in the direction parallel to the plane of the first substrate). The third electrode 30 and the fourth electrode 40 are opposite to each other, and extension directions of both the third electrode 30 and the fourth electrode 40 are perpendicular to a direction of a plane of the first electrode 10 (that is, both the third electrode and the fourth electrode extend into a sheet shape in a direction parallel to the plane of the first substrate). The first electrode 10, the second electrode 20, the third electrode 30, and the fourth electrode 40 are insulated from one another. An extension direction of the first insulating retaining wall 61s are perpendicular to the direction of the plane of the first electrode 10, and define an enclosed space 11 with the first electrode 10, the second electrode 20, the third electrode 30, and the fourth electrode 40 (referring to FIG. 8). The second transparent insulating liquid 80 is filled in the enclosed space 11, and the liquid lens 50 is located in the second transparent insulating liquid 80. The liquid lens 50 includes charged particles 52 coated by a transparent flexible film 51 and a first transparent insulating liquid 53 (referring to FIG. 9). The charged particles 52 may include positively charged particles and negatively charged particles, and a refractive index of the first transparent insulating liquid 53 is greater than a refractive index of the second transparent insulating liquid 80.

The first electrode and the second electrode may control a position of the lens in the lens unit. The third electrode and the fourth electrode may control the lens to be deformed to change a focal length of the lens, such that the switching between a short focal length and a long focal length is realized, and the lens imaging module is enabled to achieve photographing at different distances. The first insulating retaining walls may define an enclosed space with the third electrode, the fourth electrode, the first electrode, and the second electrode, and the enclosed space is configured to contain the second transparent insulating liquid and the lens. The refractive index of the first transparent insulating liquid is greater than the refractive index of the second transparent insulating liquid, which can ensure that a refractive index of the inner side of the lens is greater than a refractive index of the outer side of the lens to achieve a use function of the lens, that is, a function of the lens to refract the light rays.

According to an embodiment of the present disclosure, both the first electrode 10 and the second electrode 20 may be made of a transparent conductive material. With such a structure, on one hand, the first electrode and the second electrode have better conductivity, and on the other hand, the light rays may be incident into the lens unit through the first electrode. Optionally, both the first electrode 10 and the second electrode 20 may be made of indium tin oxide (ITO).

A material of the third electrode and the fourth electrode is not particularly limited, as long as it has better conductivity. For example, according to an embodiment of the present disclosure, the third electrode 30 and the fourth electrode 40 may be made of a transparent conductive material. Optionally, the third electrode 30 and the fourth electrode 40 may be made of ITO, or the third electrode 30 and the fourth electrode 40 may also be made of a non-transparent conductive material. Optionally, the third electrode 30 and the fourth electrode 40 may be made of a conductive material that is easy to sputter into a film, such as Cu or Ag.

Specific components of the first transparent insulating liquid and the second transparent insulating liquid are not particularly limited, as long as the refractive index of the first transparent insulating liquid is greater than the refractive index of the second transparent insulating liquid. For example, the first transparent insulating liquid 53 may be a liquid insulating medium for dispersing charged particles or a non-polar liquid with a refractive index between 1 and 3. Optionally, the non-polar liquid may be dimethyl silicone oil, and the liquid insulating medium may include at least one of non-polar alkanes, cycloalkanes, aromatic hydrocarbons, tetrachloroethylene and tetrachloromethane. The second transparent insulating liquid 80 may be pure water or a non-polar oily liquid, and the non-polar oily liquid may be silicone oil.

According to an embodiment of the present disclosure, a density of the charged particles 52 in the liquid lens 50 is less than or equal to a density of the first transparent insulating liquid 53. Thus, it can be ensured that the charged particles are suspended in the first transparent insulating liquid. When the third electrode and the fourth electrode apply a voltage to the lens, the charged particles are prone to move to one side of the electrode under the action of electrode attraction, such that the lens is deformed to change a curvature of the lens, and then the focal length of the lens is changed.

According to an embodiment of the present disclosure, a size range of the charged particles 52 may be 0.05 μm to 50 μm (micrometers), and the charged particles 52 may be transparent particles. Optionally, the charged particles 52 may include at least one of electrophoretic particles or electronic ink. Thus, the function of the lens can be realized, and the lens imaging module is suitable for use in the display panel. The electrophoretic particles may be charged particles synthesized from high molecular polymers such as polystyrene and polyethylene, or charged particles with a main material being titanium dioxide or the like. A minimum size rang of the electrophoretic particles may be 50 nm to 100 nm (nanometers), and a maximum size may be 50 μm. A minimum size range of the electronic ink may be 1 μm to 2 μm.

According to an embodiment of the present disclosure, the transparent flexible film 51 of the liquid lens 50 may include at least one of a polyimide film, a polyester film, and a polyolefin film. Therefore, the lens has better flexibility and light transmittance. When the charged particles move, the flexibility of the transparent flexible film may be configured to deform the lens so as to change the curvature of the lens, and further the focal length of the lens is changed. According to an embodiment of the present disclosure, the thickness of the transparent flexible film 51 is uniform. Therefore, when passing through the transparent flexible film, the light rays are only offset in parallel, and a propagation direction of the light rays is not changed.

According to an embodiment of the present disclosure, the number of charged particles 52 may be designed according to a specific size of the charged particles 52, as long as the lens focal length can be adjusted by controlling the distribution of the charged particles. For example, when the size of the charged particles is relatively large, a relatively small number of charged particles may be disposed in the lens. When the size of the charged particles is relatively small, a relatively large number of charged particles may be disposed in the lens.

According to an embodiment of the present disclosure, a total volume of the charged particles 52 may be 0.1% to 5% of a volume of the liquid lens 50. With such a percentage, the lens has an appropriate number of charged particles, and the above charged particles can ensure the required degree of deformation of the lens.

According to an embodiment of the present disclosure, the liquid lens 50 may be electrophoretic beads or electronic ink microcapsules. The liquid lens 50 may be separately manufactured and then immersed in the second transparent insulating liquid 80. The specific method for manufacturing the lens is not particularly limited, which, for example, can be designed by those skilled in the art based on a method for manufacturing the electrophoretic beads or electronic ink microcapsules.

According to an embodiment of the present disclosure, the first electrode 10 and the second electrode 20 are configured to form an electric field in a direction perpendicular to the first substrate 410, and the third electrode 30 and the fourth electrode 40 are configured to form an electric field in a direction parallel to the first substrate 410. An intensity of the electric field formed by the first electrode 10 and the second electrode 20 may be 1% to 20% of an intensity of the electric field formed by the third electrode 30 and the fourth electrode 40. Therefore, it can be ensured that the lens is fixed at a certain position of the lens unit by only a small force between the first electrode and the second electrode, without affecting the control of the intensity of the electric field between the third electrode and the fourth electrode over the curvature change of the lens.

According to an embodiment of the present disclosure, the voltage applied to the first electrode 10 and the second electrode 20 causes central points of the plurality of liquid lenses 50 to be located on a same plane. The position of the image sensor in the lens imaging module is fixed, and the central points of the plurality of lenses are located on the same plane. Thus, it is ensured that image distances of the plurality of lens imaging modules are consistent, such that the picture collected by each of the plurality of lens imaging module can be imaged on the image sensor.

According to an embodiment of the present disclosure, referring to FIG. 7, the lens unit 430 may further include: a second insulating retaining wall 62. The second insulating retaining wall 62 extends in a direction perpendicular to the plane of the first electrode 10, is disposed in parallel to the third electrode 30 and the fourth electrode 40, and is respectively located on a side of the third electrode 30 distal from the enclosed space and one side of the fourth electrode 40 distal from the enclosed space 11. Thus, the second insulating retaining wall can prevent the interference of charges between two adjacent lens units, and improve the accuracy of the lens units.

Alternatively, according to an embodiment of the present disclosure, the first insulating retaining wall 61 and the second insulating retaining wall 62 are connected and in an integral structure, and are rectangular to form the enclosed space. That is, the third electrode 30, the fourth electrode 40, the second transparent insulating liquid 80, and the liquid lens 50 are all accommodated in the enclosed space formed by the first insulating retaining wall 61 and the second insulating retaining wall 62 (such a case is not shown in the figure).

According to an embodiment of the present disclosure, referring to FIG. 7, the lens unit 430 may further include: light-shielding layers 70. The light-shielding layers 70 are disposed on each of a side of the first electrode 10 facing the liquid lens 50 and a side of the second electrode 20 facing the liquid lens 50. One of the light-shielding layers 70 separates the first electrode 10 from the third electrode 30, one of the light-shielding layers 70 separates the first electrode 10 from the fourth electrode 40, one of the light-shielding layers 70 separates the second electrode 20 from the third electrode 30, and one of the light-shielding layers 70 separates the second electrode 20 from the fourth electrode 40. That is, the light-shielding layers 70 are, respectively, located between the first electrode 10 and the third electrode 30, between the first electrode 10 and the fourth electrode 40, between the second electrode 20 and the third electrode 30, and between the second electrode 20 and the fourth electrode 40. Thus, when the light-shielding layer is made of an insulating material, the light-shielding layer can insulate the first electrode from the third electrode and the fourth electrode, and insulate the second electrode from the third electrode and the fourth electrode. Moreover, all the light rays incident into the lens unit can be refracted by the lens to be emitted. The material of the light-shielding layer is not particularly limited, as long as it has insulating and light-shielding effects. Those skilled in the art can design according to particular conditions.

It should be noted that the image sensor 440 in the lens imaging module 400 has the characteristic of being opaque to light. On one hand, the light rays outside the display panel are incident to the lens imaging module 400 and can be imaged in the image sensor 440 to realize the photographing function. On the other hand, both the image sensor 440 and the light-shielding layer 70 (referring to FIG. 7) in the lens unit 430 are a lightproof structure. Therefore, the lens imaging module may function as a black matrix to prevent cross-color.

According to an embodiment of the present disclosure, orthogonal projections of the light-shielding layers 70 on the first electrode 10 cover edges of an orthogonal projection of the liquid lens 50 on the first electrode 10, and areas of the light-shielding layers 70 are configured to cause all light rays incident into the lens unit 50 to be emitted after being refracted by the liquid lens 50. Therefore, when the lens is deformed, the light-shielding layer shields an edge region of the lens to ensure that all light rays incident into the lens unit can be refracted by the lens to be emitted.

According to an embodiment of the present disclosure, a data line 71 may be disposed on the light-shielding layer 70, and the data line 71 is connected to each of the third electrode 30 and the fourth electrode 40. Thus, a voltage can be applied to the third electrode and the fourth electrode through the data line, so as to realize the deformation of the lens and realize independent control over each lens unit.

According to an embodiment of the present disclosure, referring to FIG. 7, the lens unit 430 may further include: a sealant 90. The sealant 90 coats the lens unit 430, and the sealant 90 is made of a lightproof material. Thus, the lens unit can be sealed to ensure that the lens unit has better use performances. Besides, when the lens imaging module is disposed between two adjacent organic light-emitting devices, the sealant can prevent the light emitted from the organic light-emitting device from being incident into the lens imaging module. A specific position of the sealant is not particularly limited, as long as the lens unit can be sealed. For example, referring to FIG. 7, the sealant 90 is located between the first electrode 10 and the second electrode 20 and surrounds the outer sides of the second insulating retaining wall 62 and the first insulating retaining wall 61 (not shown in FIG. 7), so as to realize sealing of the lens unit. Alternatively, the sealant 90 is located between the first substrate 410 and the second substrate 420, and surrounds the outer sides of the first electrode 10, the second electrode 20, the second insulating retaining wall 62, and the first insulating retaining wall 61 (this case is not shown in the figure), so as to realize sealing of the lens unit.

It should be noted that the image sensor 440 in the lens imaging module 400, and the light-shielding layer 70 and the sealant 90 (referring to FIG. 7) in the lens unit 430 are all lightproof structures. Therefore, the lens imaging module can function as a pixel defining structure to prevent cross-color.

According to an embodiment of the present disclosure, the first substrate 410 is located on a side of the lens imaging module 400 distal from a light-emitting side of the display panel, and the image sensor 440 is disposed between the first substrate 410 and the first electrode 10. Thus, the light rays can be imaged on the image sensor after being refracted by the lens. According to an embodiment of the present disclosure, the image sensor 440 may be a charge coupled device (CCD).

Figure 10:
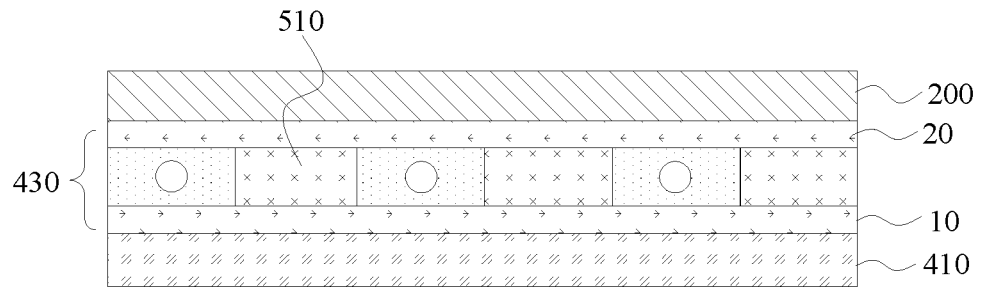
FIG. 10 shows a partial schematic structural diagram of a display panel according to an embodiment of the present disclosure.

According to an embodiment of the present disclosure, referring to FIG. 10, when the lens imaging module 400 is disposed in the color filter layer 500, the photoresist block 510 may be disposed between the first electrode 10 and the second electrode 20. Alternatively, referring to 10, when the lens imaging module 400 is disposed between two adjacent organic light-emitting devices 700, the organic light-emitting devices 700 may be disposed between the first electrode 10 and the second electrode 20. Thus, the first electrode and the second electrode can be an entire layer of electrodes, and the central points of the plurality of lenses can be located on the same plane by applying a same voltage to the entire layer of electrodes.

Figure 11:
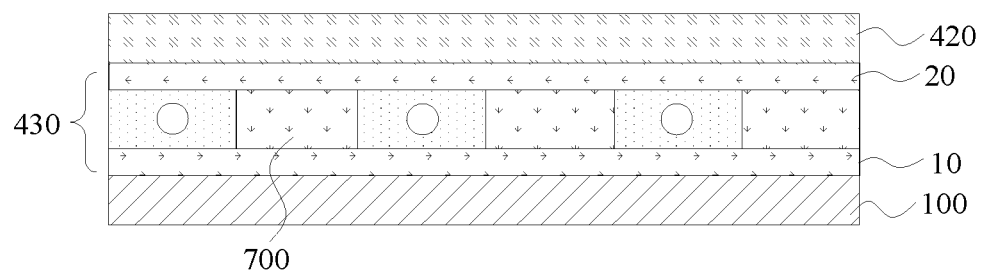
FIG. 11 shows a partial schematic structural diagram of a display panel according to another embodiment of the present disclosure.

According to an embodiment of the present disclosure, when the lens imaging module is disposed in the color filter layer, the second substrate of the lens imaging module may also be shared with the second base substrate provided with the color filter layer (as shown in FIG. 10). That is, the second electrode of the lens imaging module is disposed on the second base substrate. When the lens imaging module is disposed on the first base substrate and is located between two adjacent organic electroluminescent devices, the first substrate of the lens imaging module may also be shared with the first base substrate (as shown in FIG. 11). That is, the first electrode of the lens imaging module is disposed on the first base substrate. When the lens imaging module is disposed on the second base substrate, and an orthogonal projection of the lens imaging module on the first base substrate is located between two adjacent organic electroluminescent devices, the second substrate of the lens imaging module may also be shared with the second base substrate, that is, the second electrode of the lens imaging module is disposed on the second base substrate. Thus, the use of one substrate can be reduced, and the thickness of the display panel can be further reduced.

Figure 12:
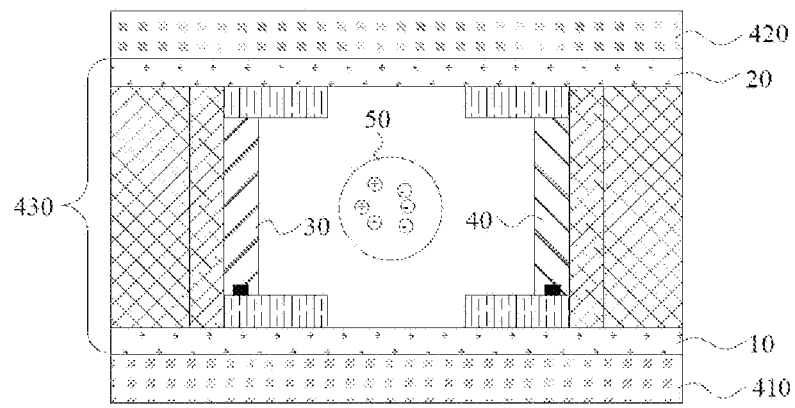
FIGS. 12 to 14 show schematic structural diagrams of a lens imaging module according to an embodiment of the present disclosure.
Figure 13:
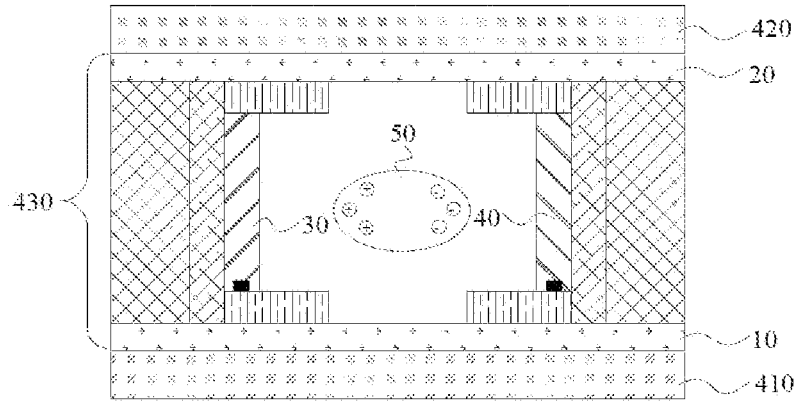
Figure 14:
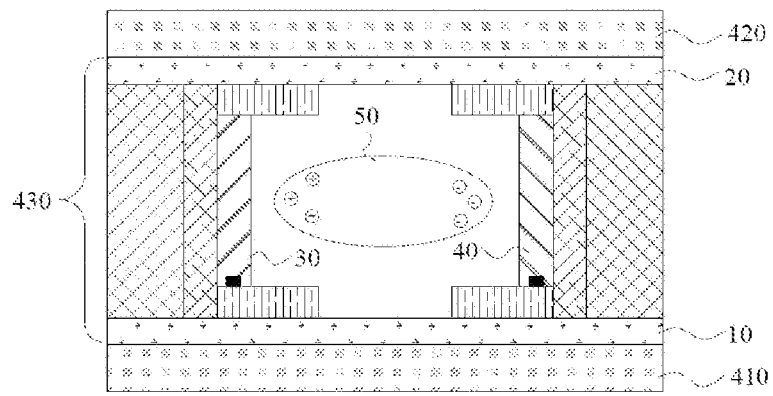

For ease of understanding, a working principle of the display panel is described in detail below:

According to an embodiment of the present disclosure, referring to FIGS. 12 to 14, the positively charged particles and the negatively charged particles in the liquid lens 50 have a mutual attraction effect. When no voltage is applied to the liquid lens 50, the liquid lens 50 is in a spherical shape (as shown in FIG. 12). When the voltage is applied to the third electrode 30 and the fourth electrode 40, the charged particles in the liquid lens 50 will move to one side proximal to the electrode under the action of an electric field formed by the third electrode and the fourth electrode. For example, the positively charged particles move to one side proximal to the negative electrode (the third electrode 30), and the negatively charged particles move to one side proximal to the positive electrode (the fourth electrode 40) (as shown in FIGS. 13 and 14). Therefore, the liquid lens 50 is deformed and further a focal length of the liquid lens 50 is changed.

When the voltages applied to the third electrode and the fourth electrode are different, attraction forces of the electrodes to the charged particles in the liquid lens are different. Therefore, the shape curvature of the liquid lens is different, and the focal length of the liquid lens is also different. For example, when a smaller voltage is applied to the third electrode 30 and the fourth electrode 40, that is, a relatively weak intensity of the electric field is formed between the third electrode 30 and the fourth electrode 40, the attraction forces of the electrodes to the charged particles are weaker, the amount of deformation of the liquid lens 50 is smaller, the radius of curvature is smaller, and the focal length of the liquid lens 50 is correspondingly smaller (as shown in FIG. 13). When a relatively large voltage is applied to the third electrode 30 and the fourth electrode 40, that is, a relatively strong intensity of the electric field is formed between the third electrode 30 and the fourth electrode 40, the attraction forces of the electrodes to the charged particles are stronger, the amount of deformation of the liquid lens 50 is larger, the radius of curvature is larger, and the focal length of the liquid lens 50 is correspondingly larger (as shown in FIG. 14). Therefore, the distribution of charged particles in the liquid lens can be controlled by controlling the voltage applied to the third electrode and the fourth electrode, such that the change of the focal length of the liquid lens is realized, thereby realizing photographing at different distances.

Figure 15:
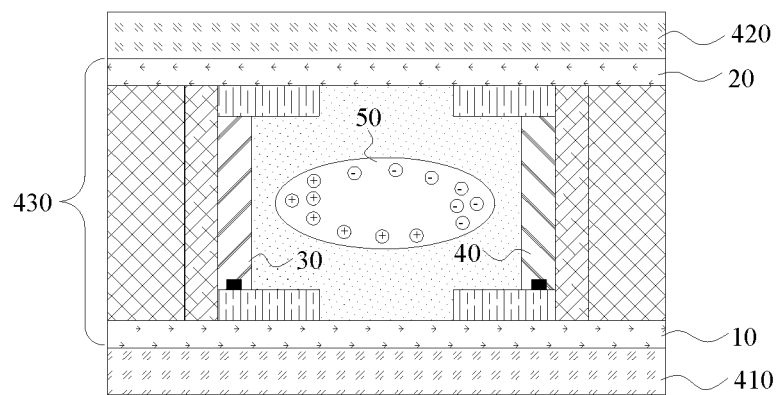
FIG. 15 shows a schematic structural diagram of a lens imaging module according to another embodiment of the present disclosure.

According to an embodiment of the present disclosure, the position of the liquid lens 50 in the lens unit 430 may be controlled by controlling the voltage applied to the first electrode 10 and the second electrode 20. The principle of controlling the position of the liquid lens by the first electrode and the second electrode is similar to the principle of controlling the focal length of the lens by the third electrode and the fourth electrode. Specifically, referring to FIG. 15, after the voltage is applied to the first electrode 10 and the second electrode 20, the charged particles in the liquid lens 50 move to one side proximal to the electrode under the action of an electric field formed by the first electrode and the second electrode. For example, the positively charged particles move to one side proximal to the negative electrode (the first electrode 10), and the negatively charged particles move to one side proximal to the positive electrode (the second electrode 20). After action forces of the positive and negative electrodes for the positively and negatively charged particles are balanced, the liquid lens can be fixed at a certain position in the lens unit.

According to an embodiment of the present disclosure, the voltage applied to the first electrode 10 and the second electrode 20 causes the central points of the plurality of liquid lenses to be located on the same plane. The position of the image sensor in the lens imaging module is fixed, and the central point of each of the plurality of liquid lens is controlled on the same plane to ensure that the image distance of each lens imaging module is consistent. Therefore, a picture captured by each lens imaging module can be imaged on the image sensor. It should be noted that the image distance in the present disclosure refers to a distance from the center of the liquid lens to the image sensor.

The specific position of each of the plurality of liquid lens is not particularly limited, as long as the central points of the plurality of liquid lenses are located on the same plane. For example, according to an embodiment of the present disclosure, the voltage applied to the first electrode 10 and the second electrode 20 causes the liquid lens 50 to be located at the central position of the lens unit 430. That is, the central point of each of the plurality of liquid lens 50 is located at the central position of the liquid lens unit.

As mentioned above, in order to ensure that the first electrode and the second electrode fix the liquid lens in the lens unit only by using a smaller force without affecting the control of the third electrode and the fourth electrode over the curvature of the liquid lens, the voltage applied to the first electrode and the second electrode needs to be 1% to 20% of the voltage applied to the third electrode and the fourth electrode.

Figure 16:
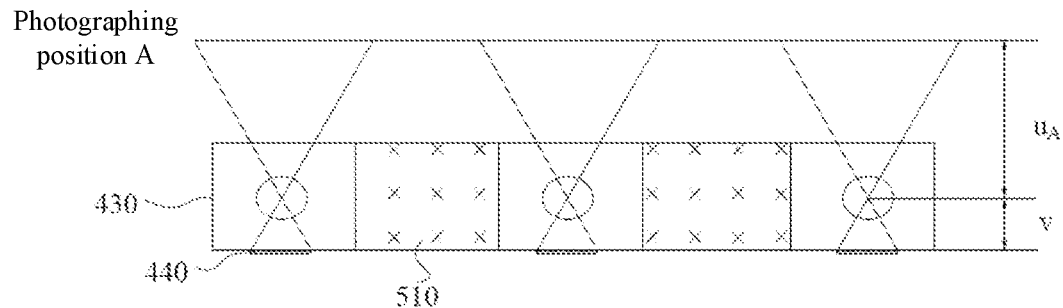
FIGS. 16 to 18 show schematic structural diagrams of a lens imaging module photographing pictures at different distances according to an embodiment of the present disclosure.
Figure 17:
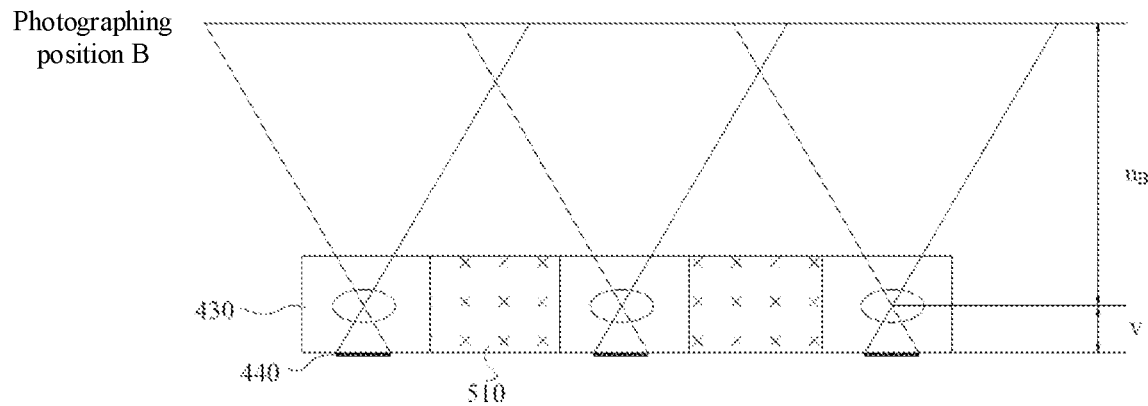
Figure 18:
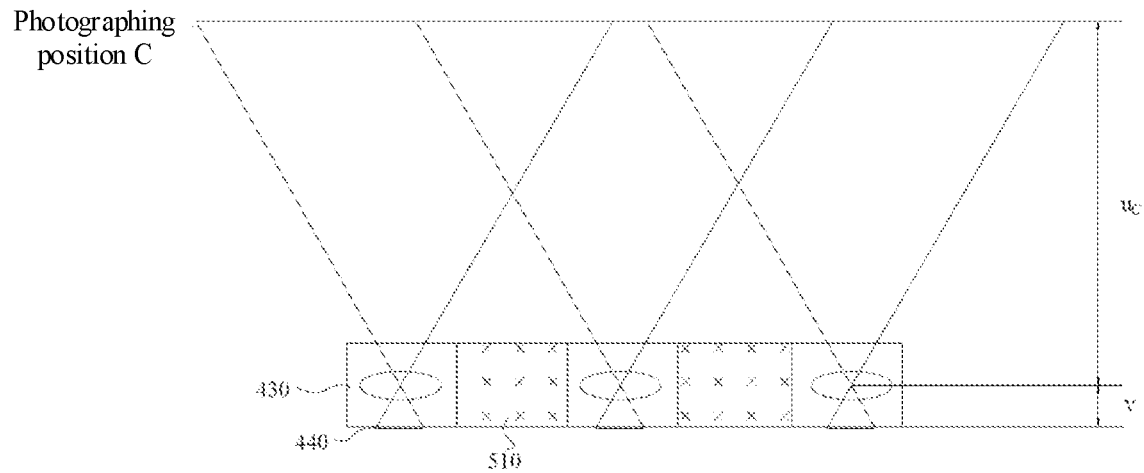

According to an embodiment of the present disclosure, when pictures at different distances are photographed, the focusing of the picture at a corresponding distance can be achieved by adjusting the voltage applied to the third electrode and the fourth electrode, and then be imaged on the image sensor to achieve the photographing function. Specifically, referring to FIGS. 16 to 18, FIG. 16 is a schematic diagram of photographing a short-distance picture, FIG. 17 is a schematic diagram of photographing a medium-distance picture, and FIG. 18 is a schematic diagram of photographing a long-distance picture. For the photographing positions in the figures, that is, the object distances $u_A < u_B < u_C$. The central points of respective liquid lenses are located on the same plane by controlling the voltage applied to the first electrode and the second electrode, and if the position of the image sensor 440 is fixed, the image distance v is fixed.

Figure 19:
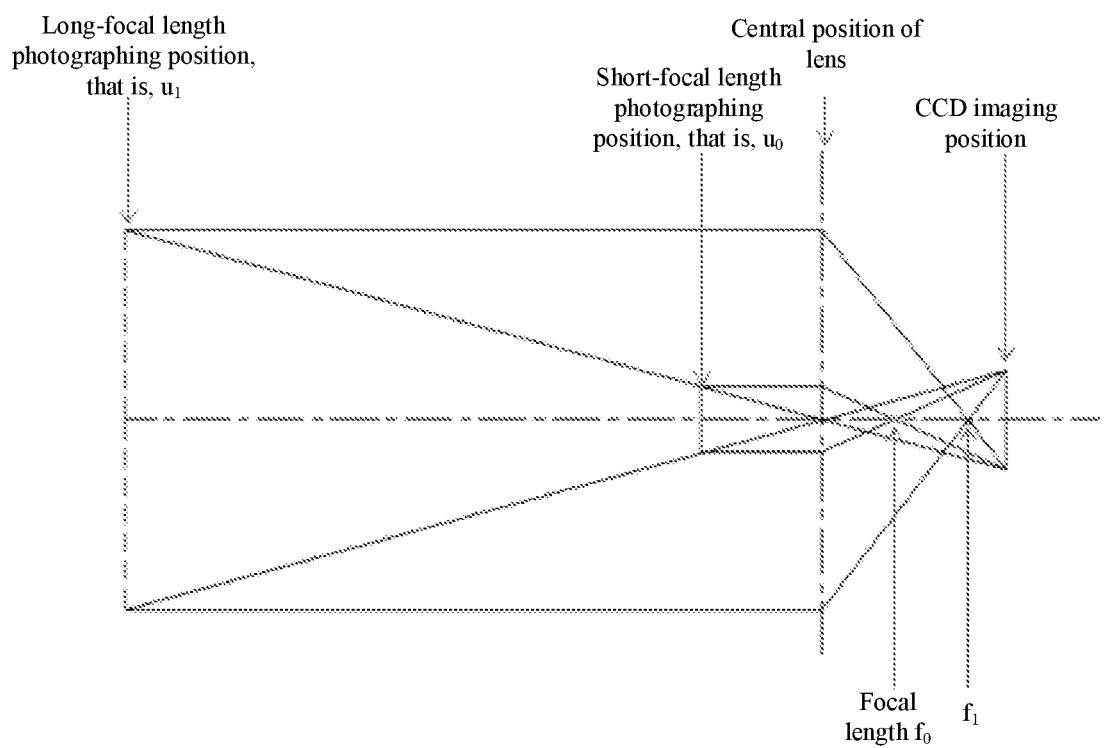
FIG. 19 shows an optical path diagram of a lens imaging module photographing pictures at different distances according to an embodiment of the present disclosure.

According to an embodiment of the present disclosure, FIG. 19 is an optical path diagram for photographing pictures at different distances, wherein the lens corresponding to long-distance photographing is a long-focal length lens, and the lens corresponding to short-distance photographing is a short-focal length lens. The image distances v of the long-focal length lens and the short-focal length lens are equal, a focal length of the long-focal length lens is $f_1$, and a focal length of the short-focal length lens is $f_0$. The long-distance picture may be imaged on the CCD after being refracted by the long-focal length lens. The short-distance picture may also be imaged on the CCD after being refracted by the short-focal length lens. The long-focal length lens may apply a larger voltage to the third electrode and the fourth electrode, such that the liquid lens can acquire a larger radius of curvature, and a larger focal length is further acquired to photograph the long-distance picture. Similarly, the short-focal length lens may apply a smaller voltage to the third electrode and the fourth electrode, such that the lens acquires a smaller radius of curvature, and a smaller focal length is further acquired to photograph the short-distance picture. Thus, the liquid lenses with different focal lengths can realize photograph the pictures at different distances.

According to the imaging law of a convex lens (Formula (1)), Formula (2) can be acquired.

$$\frac{1}{u} + \frac{1}{v} = \frac{1}{f} \quad \text{(Formula 1)}$$

$$u = \frac{fv}{v-f} \quad \text{(Formula 2)}$$

wherein u is the object distance (a distance between the photographed picture and the central point of the liquid lens), v is the image distance, and f is the focal length of the liquid lens.

Figure 20:
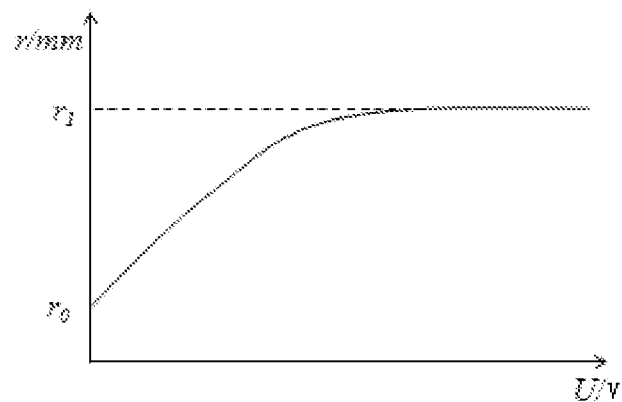
FIG. 20 shows a relationship graph between a radius of curvature of a lens and an electric field voltage according to an embodiment of the present disclosure.

In addition, according to Formula (3) and Formula (4), and by considering the relationship between the radius of curvature r of the liquid lens and the voltage U (referring to FIG. 20), $r_0$ in the figure is the radius of curvature of the liquid lens without deformation (that is, the radius of curvature of the spherical lens). With an increase of the voltage, the radius of curvature of the liquid lens gradually increases and becomes flat to reaches the limit radius of curvature $r_1$. The change range of the focal length corresponding to the above radius of curvature is $f_0 < f < f_1$, and the change range of the object distance corresponding to the above radius of curvature is $u_0 < u < u_1$, thereby acquiring Formula (5).

$$f = \frac{n_0 r}{2(n - n_0)} \quad \text{(Formula 3)}$$

$$r = f(U) \quad \text{(Formula 4)}$$

$$u = \frac{n_0 f(U) v}{2(n - n_0)(v - f)} \quad \text{(Formula 5)}$$

wherein r is the radius of curvature of the liquid lens, n is a refractive index of the liquid lens (that is, the refractive index of the first transparent insulating liquid), no is a medium refractive index (that is, the refractive index of the second transparent insulating liquid), and U is the voltage applied to the third electrode and the fourth electrode.

Thus, it can be seen from Formula (5) that the object distance u is proportional to the voltage U applied to the third electrode and the fourth electrode. In FIGS. 16 to 18, the voltage applied to the third electrode and the fourth electrode in FIG. 16 is $U_A$, the voltage applied to the third electrode and the fourth electrode in FIG. 17 is $U_B$, the voltage applied to the third electrode and the fourth electrode in FIG. 18 is $U_C$, and $U_A < U_B < U_C$. Therefore, for the radius of curvature of the liquid lens in FIGS. 16 to 18, $r_A < r_B < r_C$, for the focal length of the liquid lens in FIGS. 16 to 18, $f_A < f_B < f_C$, and finally, for the object distance in FIGS. 16 to 18, $u_A < u_B < u_C$. That is, when the long-distance picture is photographed, a larger voltage may be applied to the third electrode and the fourth electrode to cause the liquid lens to be deformed to a larger degree, so as to acquire a larger radius of curvature. Therefore, a larger focal length is acquired to realize the photographing of the long-distance picture. When the short-distance picture is photographed, a smaller voltage may be applied to the third electrode and the fourth electrode to cause the liquid lens to be deformed to a smaller degree, so as to acquire a smaller radius of curvature. Therefore, a smaller focal length is acquired to achieve the photographing of the short-distance picture. Thus, the purpose of photographing the pictures at different distances can be achieved.

It should be noted that a system algorithm may be configured to identify and reorganize the images collected by respective image sensors to present a complete photographing picture.

The range of the focal length f of the liquid lens in the present disclosure may be determined according to the range of the focal length of a camera of a current display device, and the image distance v may be determined according to the position of the image sensor and the position of the central point of the liquid lens. Thus, the range of the object distance u can be determined based on the Formula (2). The refractive index n and specific components of the first transparent insulating liquid in the liquid lens, and the refractive index no and specific components of the second transparent insulating liquid outside the liquid lens may be adjusted based on the range of the focal length f of the liquid lens. The range of the focal length f of the liquid lens only needs to meet the aforementioned range. After f, n, and $n_0$ are determined, the range of the radius of curvature r of the liquid lens can be determined based on the Formula (3). After f, n, $n_0$, v, and u are determined, the voltage U required when the pictures at different distances are photographed can be determined based on the Formula (5).

In another aspect of the present disclosure, the present disclosure provides a display device. According to an embodiment of the present disclosure, the display device includes the aforementioned display panel. Therefore, the display device has all the features and advantages of the aforementioned display panel, which will not be repeated here. In general, the display device has the function of photographing pictures under a screen, and has a better display effect and a higher screen-to-body ratio. There is no "forehead" or "chin" anymore, which is favorable to realize 100% borderless full-screen display.

Figure 21:
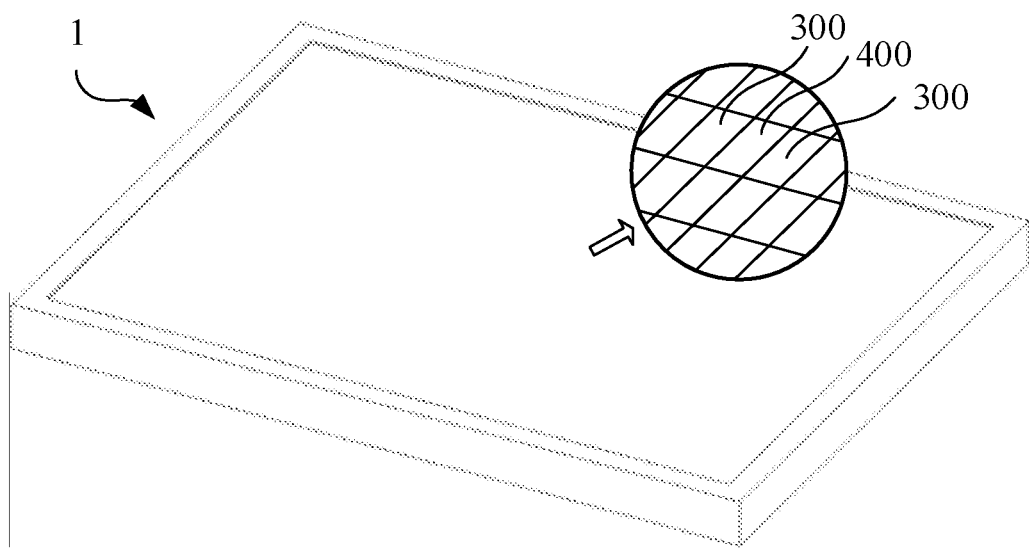
FIG. 21 shows a three-dimensional schematic structural diagram of a display device according to an embodiment of the present disclosure.

As shown in FIG. 21, which is a three-dimensional schematic structural diagram of a display device 1, a plurality of lens imaging modules in the display device may be located between two adjacent pixel units 300.

An embodiment of the present disclosure also provides a terminal. The terminal may include the aforementioned display device. Exemplarily, the terminal may include a mobile phone, a tablet computer, a smart wearable device, a notebook computer, a desktop computer, and the like.

In the description of the present disclosure, orientation or positional relationships indicated by the terms "upper," "lower," or the like are orientation or positional relationships shown based on the drawings, only for the purposes of the ease in describing the present disclosure, but not indicating that the present disclosure has to be structured and operated in a specific direction, and therefore, should not be understood as limitations to the present disclosure.

In the description of the present description, the description of referring terms such as "an embodiment" and "another embodiment" integrates particular features, structures, materials or characteristics described in combination of the embodiments and included in at least one embodiment of the present disclosure. In the present description, schematic description of the above terms does not necessarily refer to the same embodiment or example. Furthermore, the described particular features, structures, materials or characteristics can be integrated with any one or more embodiments or examples in a proper manner. In addition, various embodiments or examples described in the present description, as well as features of various embodiments or examples, may be integrated and combined without contradicting each other. In addition, it should be noted that in the present description, the terms "first" and "second" are used for descriptive purposes only, and are not to be construed as indicating or implying a relative importance or implicitly indicating the number of technical features indicated.

Although the embodiments of the present disclosure have been shown and described above, it is understandable that the above embodiments are exemplary and should not be construed as limiting the present application. Those skilled in the art could make various changes, modifications, alternatives and variations on the above embodiments within the scope of protection of the present disclosure.

What is claimed is:

1. A display panel, comprising: a first base substrate and a second base substrate which are opposite to each other, and a plurality of lens imaging modules; wherein
the first base substrate comprises a plurality of pixel units arranged in an array, and each of the lens imaging modules comprises an image sensor and a lens unit with an adjustable focal length; and the plurality of lens imaging modules are between the first base substrate and the second base substrate, an orthogonal projection of the lens imaging module on the first base substrate is between two adjacent pixel units; the lens imaging module comprises a first substrate and a second substrate which are opposite to each other, and the image sensor and the lens unit are between the first substrate and the second substrate;

the lens unit comprises:

a first electrode and a second electrode, wherein the first electrode is on a side of the first substrate facing the second substrate, the second electrode is on a side of the second substrate facing the first substrate, and extension directions of both the first electrode and the second electrode are parallel to a direction of a plane of the first substrate;

a third electrode and a fourth electrode which are opposite to each other, wherein extension directions of both the third electrode and the fourth electrode are perpendicular to a direction of a plane of the first electrode, and the first electrode, the second electrode, the third electrode, and the fourth electrode are insulated from one another;

a first insulating retaining wall, wherein an extension direction of the first insulating retaining wall is perpendicular to the direction of the plane of the first electrode, and defines an enclosed space with the first electrode, the second electrode, the third electrode, and the fourth electrode;

a second transparent insulating liquid filled in the enclosed space; and a liquid lens in the second transparent insulating liquid.

2. The display panel according to claim 1, wherein a color filter layer is on a side of the second base substrate facing the first base substrate, wherein the color filter layer comprises a plurality of photoresist blocks, and the lens imaging module is in the color filter layer and between two adjacent photoresist blocks.

3. The display panel according to claim 1, wherein the pixel unit comprises an organic electroluminescent device, the pixel unit is on a side of the first base substrate facing the second base substrate, and the lens imaging module is on the first base substrate and between two adjacent organic electroluminescent devices.

4. The display panel according to claim 1, wherein the pixel unit comprises an organic electroluminescent device, the pixel unit is on a side of the first base substrate facing the second base substrate, the lens imaging module is on a side of the second base substrate facing the first base substrate, and the orthogonal projection of the lens imaging module on the first base substrate is between two adjacent organic electroluminescent devices.

5. The display panel according to claim 1, wherein the liquid lens comprises charged particles coated by a transparent flexible film and a first transparent insulating liquid, wherein the charged particles comprise positively charged particles and negatively charged particles, and a refractive index of the first transparent insulating liquid is greater than a refractive index of the second transparent insulating liquid.

6. The display panel according to claim 5, wherein a density of the charged particles is less than or equal to a density of the first transparent insulating liquid.

7. The display panel according to claim 5, wherein a size range of the charged particles is 0.05 μm to 50 μm, and the charged particles comprise at least one of electrophoretic particles or electronic ink.

8. The display panel according to claim 5, wherein a total volume of the charged particles is 0.1% to 5% of a volume of the liquid lens.

9. The display panel according to claim 1, wherein the first electrode and the second electrode are configured to form an electric field in a direction perpendicular to the first substrate, the third electrode and the fourth electrode are configured to form an electric field in a direction parallel to the first substrate, and an intensity of the electric field formed by the first electrode and the second electrode is 1 to 20% of an intensity of the electric field formed by the third electrode and the fourth electrode.

10. The display panel according to claim 9, wherein the electric field formed between the first electrode and the second electrode causes central points of the plurality of liquid lenses to be on a same plane.

11. The display panel according to claim 1, wherein the first substrate is on a side of the lens imaging module distal from a light-emitting side of the display panel, and the image sensor is between the first substrate and the first electrode.

12. The display panel according to claim 1, wherein the lens unit comprises:

a second insulating retaining wall, wherein an extension direction of the second insulating retaining wall is perpendicular to the direction of the plane of the first electrode, is parallel to the third electrode, and is on each of a side of the third electrode distal from the enclosed space and a side of the fourth electrode distal from the enclosed space.

13. The display panel according to claim 12, wherein the lens unit comprises:

light-shielding layers, wherein the light-shielding layers are on each of a side of the first electrode facing the liquid lens and a side of the second electrode facing the liquid lens, and the light-shielding layers are, respectively, between the first electrode and the third electrode, between the first electrode and the fourth electrode, between the second electrode and the third electrode, and between the second electrode and the fourth electrode.

14. The display panel according to claim 13, wherein orthogonal projections of the light-shielding layers on the first electrode cover edges of an orthogonal projection of the liquid lens on the first electrode, and areas of the light-shielding layers are configured to cause all light rays incident into the lens unit to be emitted after being refracted by the liquid lens.

15. The display panel according to claim 13, wherein a data line is on the light-shielding layer, wherein the data line is connected to each of the third electrode and the fourth electrode.

16. The display panel according to claim 1, wherein a color filter layer is on a side of the second base substrate facing the first base substrate, the color filter layer comprises a plurality of photoresist blocks, and the lens imaging module is in the color filter layer and two adjacent photoresist blocks;

the pixel unit comprises an organic electroluminescent device, and the lens imaging module is on the first base substrate and between two adjacent organic electroluminescent devices.

17. A display device comprising a display panel comprising: a first base substrate and a second base substrate which are opposite to each other, and a plurality of lens imaging modules; wherein the first base substrate comprises a plurality of pixel units arranged in an array, and each of the lens imaging modules comprises an image sensor and a lens unit with an adjustable focal length; and the plurality of lens imaging modules are between the first base substrate and the second base substrate, an orthogonal projection of the lens imaging module on the first base substrate is between two adjacent pixel units; the lens imaging module comprises a first substrate and a second substrate which are opposite to each other, and the image sensor and the lens unit are between the first substrate and the second substrate;

the lens unit comprises:

a first electrode and a second electrode, wherein the first electrode is on a side of the first substrate facing the second substrate, the second electrode is on a side of the second substrate facing the first substrate, and extension directions of both the first electrode and the second electrode are parallel to a direction of a plane of the first substrate;

a third electrode and a fourth electrode which are opposite to each other, wherein extension directions of both the third electrode and the fourth electrode are perpendicular to a direction of a plane of the first electrode, and the first electrode, the second electrode, the third electrode, and the fourth electrode are insulated from one another;

a first insulating retaining wall, wherein an extension direction of the first insulating retaining wall is perpendicular to the direction of the plane of the first electrode, and defines an enclosed space with the first electrode, the second electrode, the third electrode, and the fourth electrode;

a second transparent insulating liquid filled in the enclosed space; and a liquid lens in the second transparent insulating liquid.

18. A terminal comprising the display device as defined in claim 17.

* * * * *